(12) United States Patent
Ozaki et al.

(10) Patent No.: US 6,472,305 B1
(45) Date of Patent: Oct. 29, 2002

(54) METHOD OF MANUFACTURING BONDED STRUCTURE OF FILM SUBSTRATE AND SEMICONDUCTOR CHIP

(75) Inventors: Shiro Ozaki, Shiki; Kenji Edazawa, Iruma; Kazuhiro Sugiyama, Kunitachi, all of (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/536,049

(22) Filed: Mar. 27, 2000

(30) Foreign Application Priority Data

Apr. 8, 1999 (JP) ............................. 11-100926

(51) Int. Cl.[7] .............................................. H01L 21/44
(52) U.S. Cl. ...................... 438/613; 438/614; 438/615; 257/689
(58) Field of Search ................... 438/25, 26, 51, 438/55, 458; 257/686–689, 676, 692, 690, 696, 780, 784, 669

(56) References Cited

U.S. PATENT DOCUMENTS 5,378,859 A    1/1995  Shirasaki et al.
5,688,716 A  * 11/1997  DiStefano et al. ............ 438/55
6,181,003 B1 *  1/2001  Ohuchi ........................ 257/690
6,307,260 B1 * 10/2001  Smith et al. ................. 257/696

* cited by examiner

Primary Examiner—David Nelms
Assistant Examiner—Dung Anh Le
(74) Attorney, Agent, or Firm—Frishauf, Holtz, Goodman & Chick, P.C.

(57) ABSTRACT

The bonding conditions for bonding a semiconductor chip to a film substrate are controlled to allow an adhesive positioned right under the junction between the first connection terminal of the film substrate and the bump electrode of a semiconductor chip to be pushed out to form an opening in the adhesive layer. As a result, the junction between the first connection terminal and the bump electrode floats from the upper surface of the adhesive layer and supports the semiconductor chip in the floating state. It follows that is possible to prevent crack occurrence derived from the difference in thermal expansion coefficient in the junction between the first connection terminal and the bump electrode, thereby ensuring a good electrical connection.

13 Claims, 9 Drawing Sheets

METHOD OF MANUFACTURING BONDED STRUCTURE OF FILM SUBSTRATE AND SEMICONDUCTOR CHIP

CROSS-REFERENCE TO RELATED APPLICATIONS

This application is based upon and claims the benefit of priority from the prior Japanese Patent Application No. 11-100926, filed Apr. 8, 1999, the entire contents of which are incorporated herein by reference.

BACKGROUND OF THE INVENTION

The present invention relates to a so-called "COF (Chip On Film)" technology and provides a bonded structure of a film substrate and a semiconductor-chip and a method of manufacturing the same.

In, for example, a semiconductor device called BGA (ball grid array), a semiconductor chip forming, for example, an LSI is disposed on an interposer, and solder balls are arranged on the lower surface of the interposer to form a matrix. FIG. 17 is a cross sectional view exemplifying a conventional semiconductor device of this type. As shown in the figure, the semiconductor device comprises an interposer 1 having a planar size somewhat larger than that of a semiconductor chip 7 and made of a hard material such as a ceramic material, a glass fiber-containing epoxy resin, etc. An adhesive layer 2 is formed on an upper surface of the interposer 1. First terminals 3 are mounted to the peripheral portion on the upper surface of the adhesive layer 2 in a manner to correspond to bump electrodes 8 mounted to the peripheral portion on the lower surface of the semiconductor chip 7. Second connection terminals 4 are formed at predetermined portions on the upper surface of the adhesive layer 2 in a manner to form a matrix. The first terminals 3 and second terminals 4 are connected to each other vial connection wirings (not shown) formed appropriately on the upper surface of the adhesive layer 2. Circular holes 5 are formed through the interposer 1 and the adhesive layer 2 at positions corresponding to predetermined positions of the second connection terminals 4. Solder balls 6 positioned within and extending downward from the circular holes 5 are connected to the second connection terminals 4. Further, the bump electrodes 8 are respectively bonded to the first connection terminals 3 to allow the semiconductor chip 1 to be mounted on the interposer 1.

In the conventional semiconductor device of the construction described above, the first connection terminals 3, the second connection terminals 4 and the connection wirings connecting these first and second connection terminals 3 and 4 are bonded to the upper surface of the interposer 1 with the adhesive layer 2 interposed therebetween. As a result, it is impossible to displace, particularly, the first connection terminals 3 relative to the interposer 1. It follows that cracks tend to be generated at the junctions between the first connection terminals 3 and the bump electrodes 8 because of the stress derived from the difference in thermal expansion coefficient between the interposer 1 and the semiconductor chip 7. The crack generation causes a poor electric connection between the first connection terminals 3 and the bump electrodes 8.

BRIEF SUMMARY OF THE INVENTION

An object of the present invention is to provide a structure that absorbs stress at the connection terminals of the substrate so as to prevent crack occurrence at the junction between the first connection terminal and the bump electrode, thereby insuring a good.electrical connection.

According to the present invention, there is provided a semiconductor device, comprising:

a semiconductor chip having a plurality of electrodes;

a substrate on which the semiconductor chip is mounted; and a plurality of connection terminals arranged to correspond to the semiconductor chip, each connection terminal having one end and the other end, the one end of each connection terminal being fixed to the substrate, with the other end being bonded to the electrode and rendered free relative to the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIGS. 1 to 8 show manufacturing steps of a semiconductor device according to a first embodiment of the present invention. The construction and manufacturing method of the semiconductor device in this embodiment will now be described with reference to these figures. In the first step, a film substrate 11 is prepared for forming an interposer. The film substrate 11 is made of, for example, polyamide, and an adhesive layer 12 consisting of a polyamide-based adhesive, a polyamide-based adhesive, an epoxy-based adhesive, etc. is formed on the upper surface of the film substrate 11. In this case, the film substrate 11, which is large, is transferred by a roll-to-roll system.

Figure 1:
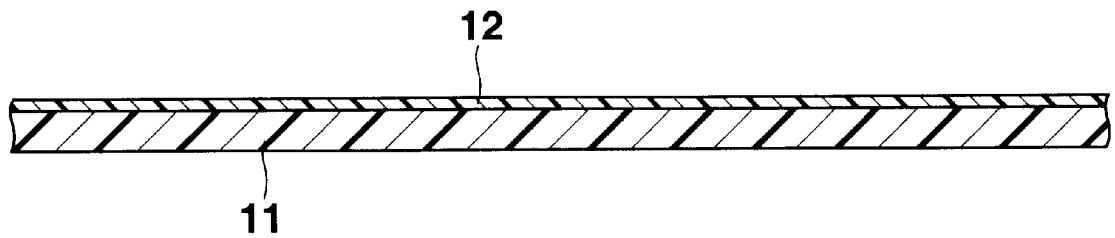
FIGS. 1 to 8 are cross sectional views showing in a magnified fashion gist portions of a film substrate and a semiconductor chip in the manufacturing process for describing an embodiment of the connection method between the film substrate and the semiconductor chip of the present invention.
Figure 2:
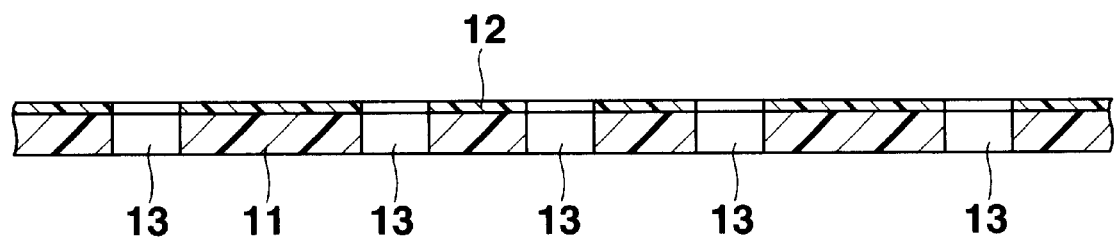
Figure 3:
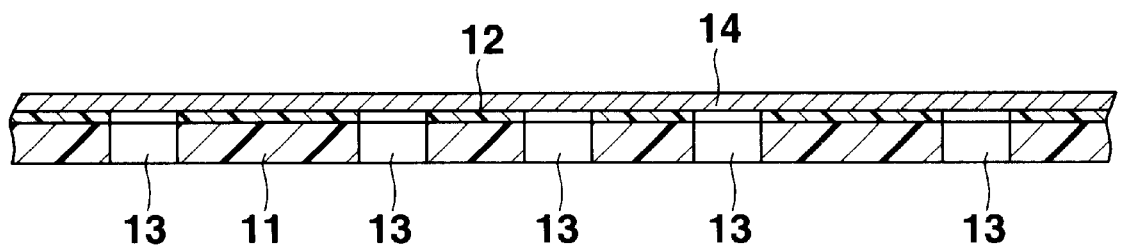
Figure 4:
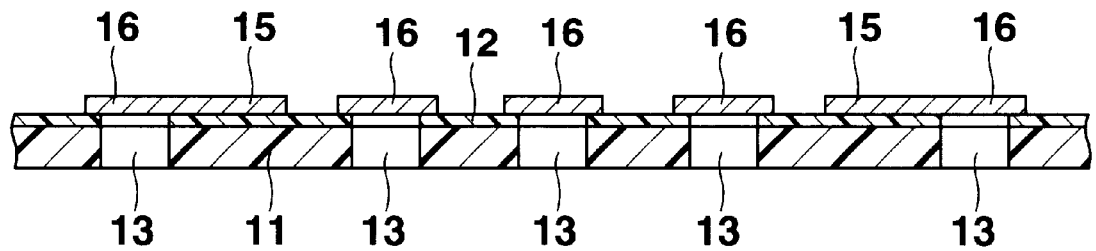

In the next step, circular holes 13 are formed by punching using an ordinary mold through predetermined portions of the film substrate 11 and the adhesive layer 12, as shown in FIG. 2. At the same time, sprocket holes (not shown) are formed along both side edges in the width direction of the film substrate 11. Then, a copper foil 14 is formed on the upper surface of the adhesive layer 12, as shown in FIG. 3, followed by patterning the copper foil 14 by the ordinary photolithography so as to form first connection terminals 15, second connection terminals 16 and connection wirings (not shown), as shown in FIG. 4. In this case, the second connection terminal 16 is formed to cover the circular hole 13. Further, a plating layer (not shown) made of metal such as tin or solder is formed by an electroless plating on the surfaces of the first connection terminals 15, the second connection terminals 16 and the connection wirings.

Figure 5:
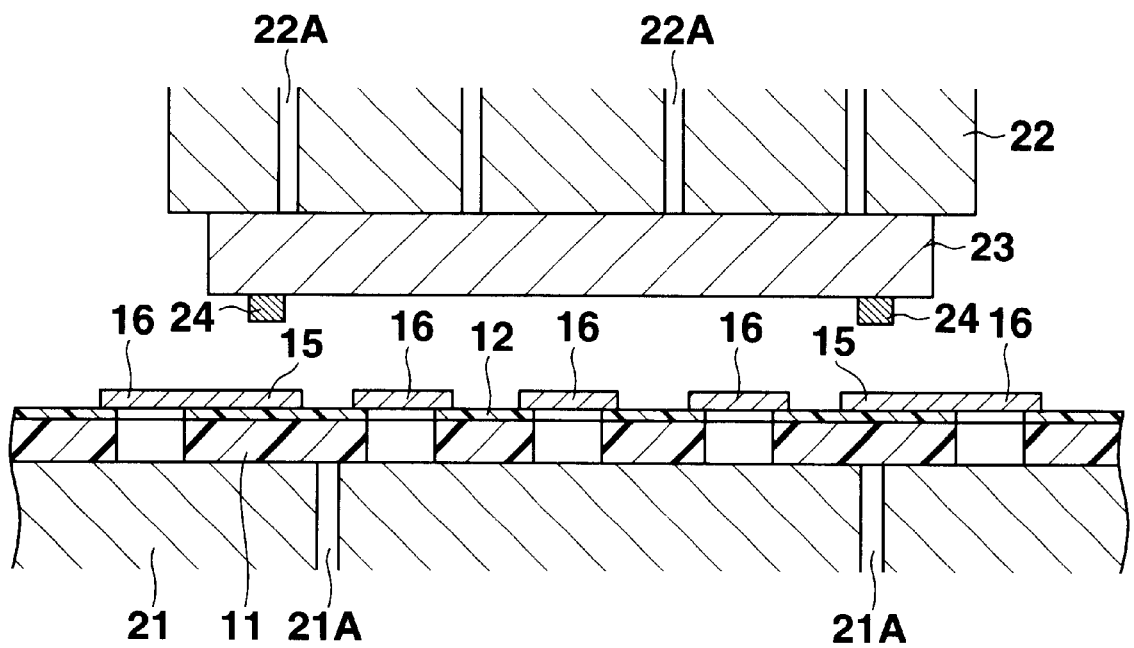
Figure 6:
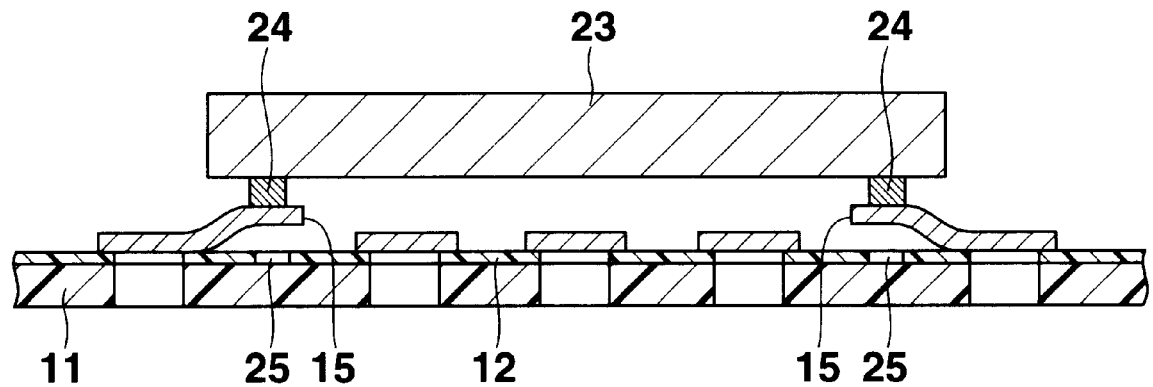
Figure 7:
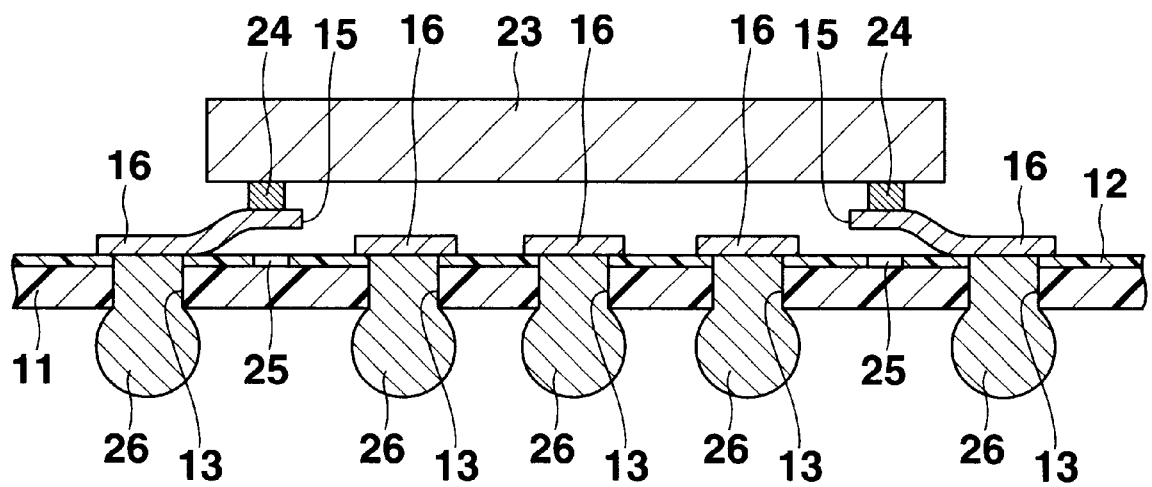

In the next step, the film substrate 11 is positioned accurately on the upper surface of a bonding stage 21, followed by fixing the film substrate 11 to the upper surface of the bonding stage 21 by vacuum suction through a plurality of air passageways 21A formed through the bonding stage 21, as shown in FIG. 5. Then, a semiconductor chip 23 is fixed to the lower surface of a bonding head 22 by vacuum suction through a plurality of air passageways 22A formed through the bonding head 22. Under this condition, the semiconductor chip 23 and the film substrate 11 are aligned with each other, and the bonding head 22 is heated so as to allow bump electrodes 24 projecting downward from an;outer circumferential region of the semiconductor chip 23 to be bonded to the first connection terminals 15 of the film substrate 11. In this case, the bonding conditions, which will be described herein later in detail, should be selected appropriately such that an open portion 25 is formed in the adhesive layer 12 positioned below the junction between the bump electrode 24 made of gold and mounted in the peripheral portion on the lower surface of the semiconductor chip 23 and the first connection terminal 15. As shown in FIG. 6, the part of the first connection terminal 15 connected to the bump electrode 24 floats from the upper surface of the adhesive layer 12 and thus the terminal 15 is bent appropriately upward.

Figure 8:
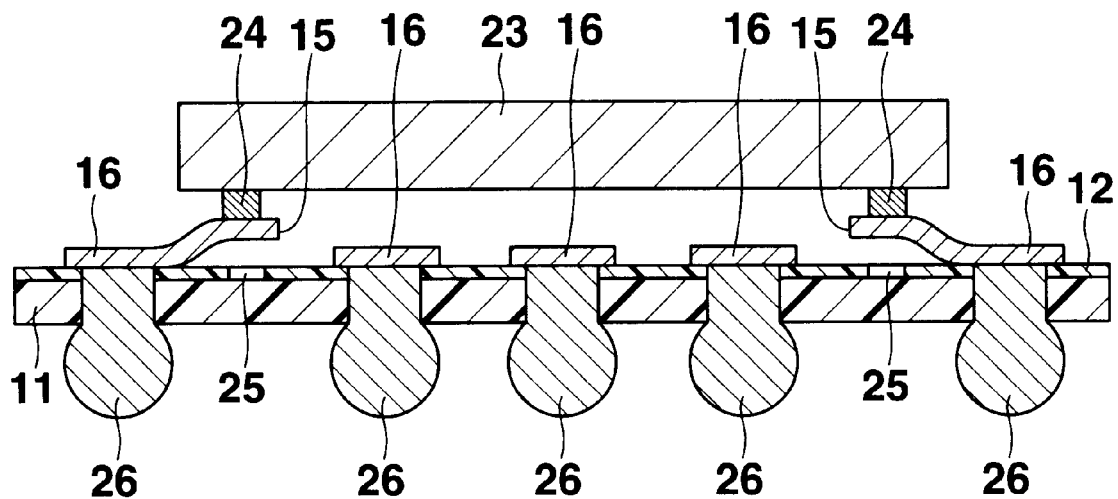

In the next step, solder balls 26 are formed to fill the circular holes 13 made in the film substrate 11 so as to be respectively connected to the second connection terminals 16 and to project downward from the circular holes 13. This process can be performed by mounting a solder ball in the circular hole 13 made in the film substrate 11, followed by melting the solder ball to permit reflow of the solder ball. In the next step, the film substrate 11 is cut in a predetermined shape and size at a plurality of cutting lines such that each cut section includes at least one semiconductor chip 23, thereby obtaining a plurality of semiconductor devices each constructed as shown in FIG. 8.

The bonding conditions will now be described. Specifically, the:thickness of the film substrate 11 made of polyimide was set at 75 $\mu$m. The thickness of the adhesive layer 12 made of a polyimide-base adhesive was set at 8 $\mu$m. The thickness of the copper foil 14 was set at 18 $\mu$m. The thickness of the tin plating layer was set at 0.65 $\mu$m after the plating step and at 0.2 $\mu$m (Kocour value which shows the thickness of the tin plating layer remained on a surface of the copper foil 14 with the exception of the dispersed depth into the foil 14) after the annealing step. Further, the temperature of the bonding stage 21 was set at 100° C. Bonding was performed by changing the bonding conditions as follows.

First of all, bonding was performed by setting the bonding temperature at 260° C., 290° C., 320° C. and 350° C. In this case, the bonding load was set at 12 mgf/$\mu$m$^2$, and the bonding time was set at 5 seconds. It has been found that, where the bonding temperature was set at 260° C., the opening 25 was not formed in the adhesive layer 12, though the opening 25 was formed in the adhesive layer 12 under the other bonding temperatures. Bonding was also performed with the bonding load set at 4 mgf/$\mu$m$^2$, 8 mgf/$\mu$m$^2$ and 12 mgf/$\mu$m$^2$. In this case, the bonding temperature was set at 350° C., and the bonding time was set at 5 seconds. It has been found that, where the bonding load was set at 4 mgf/$\mu$m$^2$, the opening 25 was not formed in the adhesive layer 12, though the opening 25 was formed in the adhesive layer 12 under the other bonding loads. Finally, bonding was performed by setting the bonding time at 1 second, 2 seconds, 3 seconds, 4 seconds, 5 seconds and 10 seconds. In this case, the bonding temperature was set at 350° C. and the bonding load was set at 12 mgf/$\mu$m$^2$. It has been found that, where the bonding time was set at 1 second, the opening 25 was not formed in the adhesive layer 12, though the opening 25 was formed in the adhesive layer 12 under the other bonding time.

Figure 9:
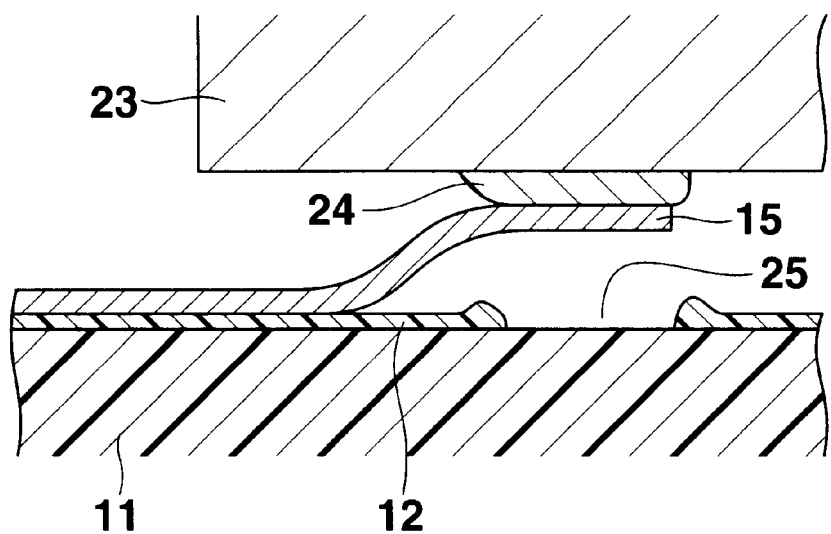
FIG. 9 is a cross sectional view showing in detail in a magnified fashion the bonding portion shown in FIG. 7.

As described above, the opening 25 is formed in the adhesive layer 12 if the bonding conditions are set appropriately so as to form the structure that the part of the first connection terminal 15 connected to the bump electrode 24 floats from the upper surface of the adhesive layer 12, and then thei terminal 15 is upwardly bent appropriately. After the bonding under predetermined bonding conditions, a metallurgical micrograph of the junction between the first connection terminal 15 and the bump electrode 24 was observed. FIG. 9 shows the construction clarified by the observation. As shown in the figure, the adhesive positioned right under the junction between the first connection terminal 15 and the bump electrode 24 is pushed out to form the opening 25 in the adhesive layer 12, and the part of the first connection terminal 15 connected to the bump electrode 24 floats from the upper surface of the adhesive layer 12 so that the terminal 15 is bent upward appropriately. In the embodiment shown in FIGS. 6 and 9, the first connection terminal 15 begins to float up from the upper surface of the adhesive layer 12 inside the side surface of the semiconductor chip 23. However, it is possible for the first connection terminal 15 to begin to float up from the upper surface of the adhesive layer 12 outside the side surface of the semiconductor chip 23.

Figure 10A:
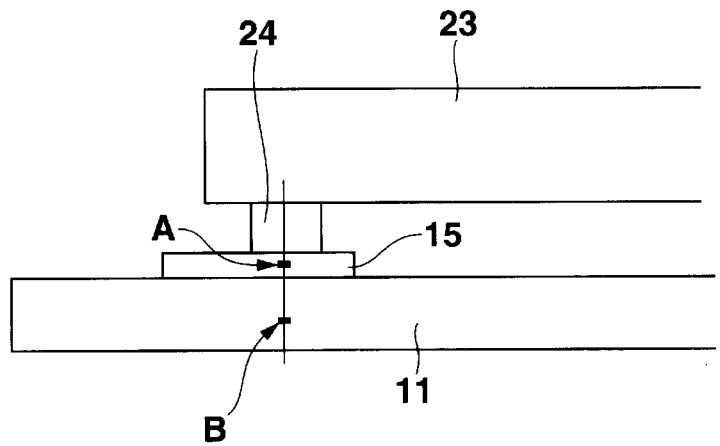
FIGS. 10A and 10B show why the state shown in FIG. 9 is obtained.
Figure 10B:
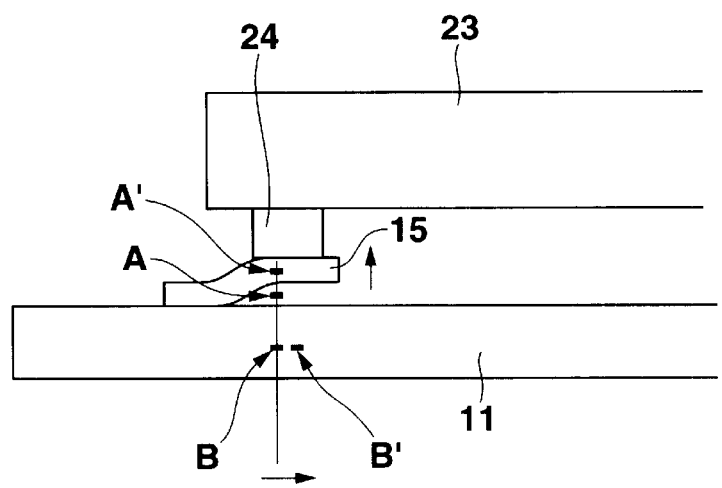

FIGS. 10A and 10B show the function of the particular structure. Specifically, FIG. 10A is a cross sectional view showing in a magnified fashion the state that the bump electrode 24 of the semiconductor chip 23 is bonded to the first connection terminal 15 by compression under heat of the semiconductor chip 23 with a bonding head (not shown). Under this state, the bump electrode 24 and the first connection terminal 15 are heated. As a result, the adhesive positioned below the junction with the bump electrode 24 is melted as shown in FIG. 9 so as to be pushed out and, thus, to form the opening 25 in the adhesive layer 12. In the opening 25, the adhesive layer 12 substantially loses the function of an adhesive. It should also be noted that the film substrate 11 is thermally elongated by the heat in the bonding step, with the result that a predetermined point B of the film substrate 11 is moved to the left from the position before the bonding. A point A of the first connection terminal 15 shown in FIG. 10A corresponds to point B under the state described above. Then, if the heating of the bonding head is stopped with the semiconductor chip 23 kept compressed, the bump electrode 24 and the first connection terminal 15 are cooled and alloyed. Also, the temperature of the film substrate 11 is lowered so as to shrink the film substrate 11. As a result, the point B is moved to the right so as to be brought back to point B' before the bonding, as shown in FIG. 10B. In this step, the first connection terminal 15 bonded to the film substrate 11 by the adhesive layer on the left side of point A is incapable of moving to the right together with shrinkage of the film substrate 11 because the first connection terminal 15 is integral with the bump electrode 24. As a result, a moment in the counterclockwise direction exerts on the first connection terminal 15. Therefore, point A is moved to an upper point A' when the first connection terminal 15 is moved upward. Also, the first connection terminal 15 is bent so as to balance with the weight of the semiconductor chip 23 and supports the semiconductor chip 23.

In the semiconductor device thus obtained, that portion of the first connection terminal 15 which is bonded to the bump electrode 24 floats from the upper surface of the adhesive layer 12. Therefore, the floating portion of the first, connection terminal 15 can be displaced relative to the film substrate 11. It follows that the stress derived from the difference in thermal expansion coefficient between the semiconductor chip 23 and the film substrate 11 can be absorbed by the first connection terminal 15, making it possible to prevent crack occurrence and to ensure satisfactory electrical connection.

In the embodiment described above, the adhesive layer 12 is melted by the heating in the bonding step so as to form the opening 25 and, thus, to loose the function of adhesive. However, it is not absolutely necessary to melt,the adhesive layer 12. For example, any kind of an adhesive layer can be used in the present invention as far as the adhesive layer looses the adhesive force by heating, e.g., as far as the adhesive layer is hardened or the characteristics of the adhesive layers are changed by heating.

Figure 11:
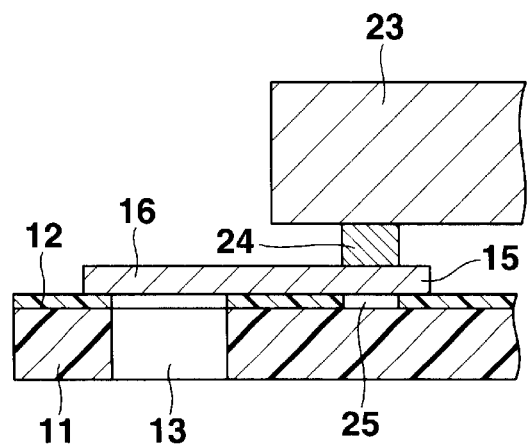
FIG. 11 is across sectional view showing in a magnified fashion a film substrate and a semiconductor chip for describing a second embodiment of the present invention.

In the embodiment described above, the part of the first connection terminal 15 connected to the bump electrode 24 clearly floats from the film substrate 11. However, the stress can be absorbed as far as the junction noted above is not in contact with the film substrate 11 as shown in FIG. 11, even if the junction part does not clearly float from the film substrate 11.

Figure 12A:
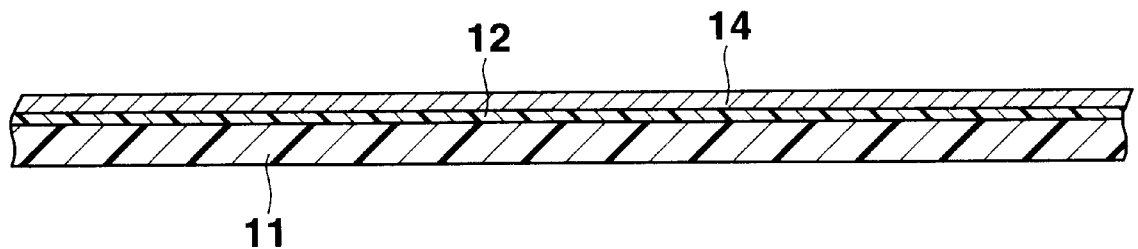
FIGS. 12A to 12C are cross sectional views showing in a magnified fashion a film substrate for describing a third embodiment of the present invention.
Figure 12B:
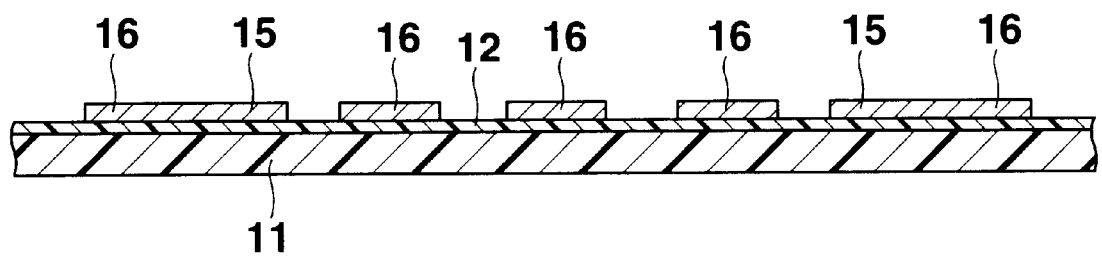
Figure 12C:
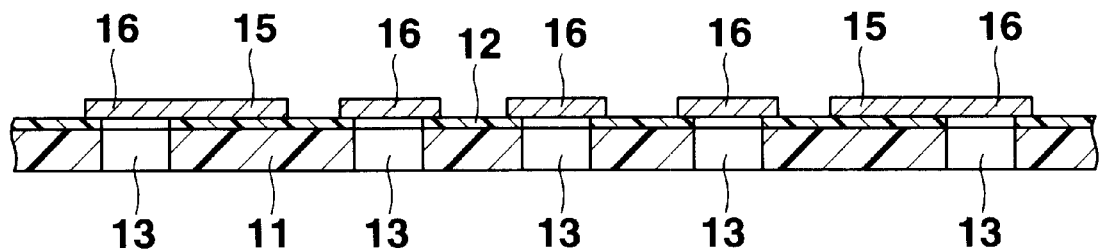

Also, in the embodiment described above, the circular holes 13 are formed by punching through the film substrate 11 and the adhesive layer 12 in the step shown in FIG. 2. However, the present invention is not limited to the particular punching step. Alternatively, the circular holes 13 can be formed as shown in FIGS. 12A to 12C according to a third embodiment of the present invention. In the first step, the copper foil 14 is formed on the upper surface of the film substrate 11 with the adhesive layer 12 interposed therebetween, as shown in FIG. 12A. Then, sprocket holes (not shown) are formed by punching along both side edges in the width direction of the film substrate 11, the adhesive layer 12 and the copper foil 14. After formation of the sprocket holes, the copper foil 14 is patterned by photolithography technology to form the first connection terminals 15, the second connection terminals 16 and the connection wirings (not shown), as shown in FIG. 12B. Then, the circular holes 13 are formed through those portions of the film substrate 11 and the adhesive layer 12 which correspond to predetermined positions of the second connection terminals 16 by irradiation with laser such as an excimer laser or a YAG laser.

Figure 13:
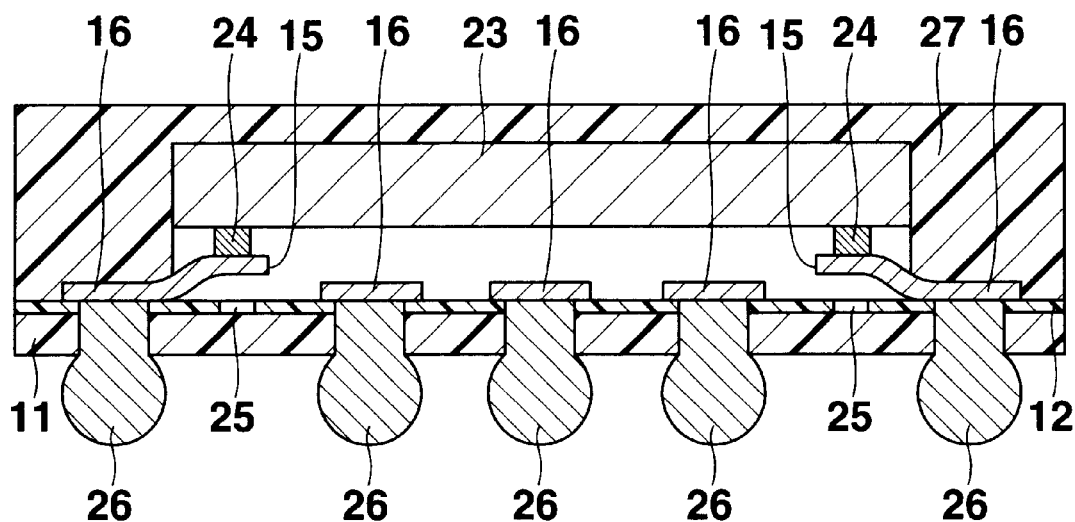
FIG. 13 is a cross sectional view showing in a magnified fashion:the sealing structure after a film substrate and a semiconductor chip are bonded to each other, which constitutes one embodiment of the present invention.

FIG. 13 shows a first example of sealing the semiconductor chip 23. In this case, a resin sealing film 27 made of an epoxy resin or the like is formed on the upper surface, including the semiconductor chip 23 and excluding the sprocket hole-forming region, of the film substrate 11 by, for example, a screen printing method. Therefore, an under-filling material is not present between the semiconductor chip 23 and the film substrate 11, and air is present in the particular region to form a clearance.

Figure 14:
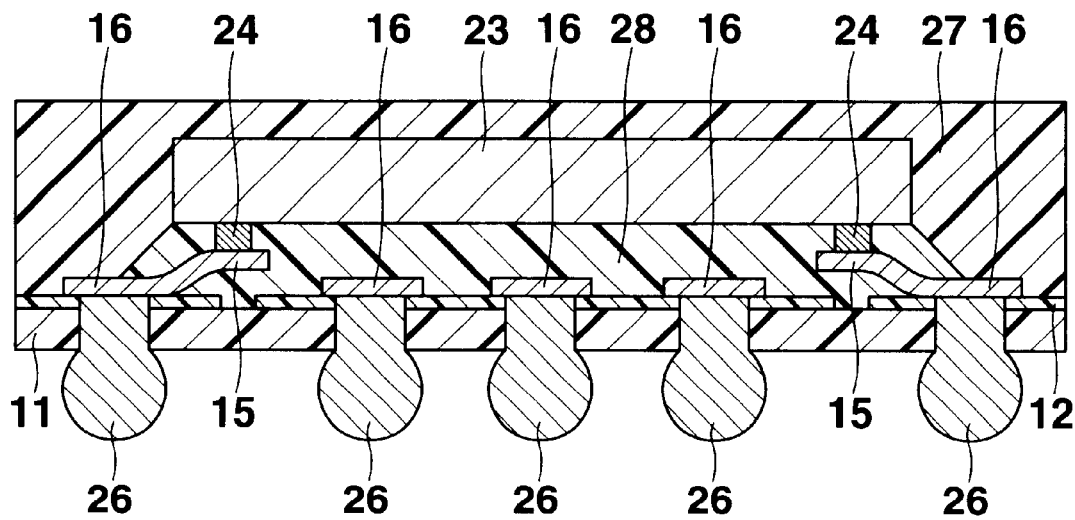
FIG. 14 is a cross sectional view showing in a magnified fashion a modification of FIG. 13.

FIG. 14 shows a second example of sealing the semiconductor chip 23. In this case, an under-filling material 28 is potted on the film substrate 11 around the semiconductor chip 23 by a potting method or dispenser method after the bonding step shown in FIG. 6 so as to permit the under-filling material 28 to enter the clearance between the semiconductor chip 23 and the film substrate 11 by the capillary phenomenon. An ordinary under-filling material 28 prepared by loading, for example, a filler made of silica in a resin such as an epoxy resin can be used in this case. However, it is desirable to use an elastic resin such as a silicone resin or a silicone-denatured epoxy resin as the under-filling material 28 in order to facilitate displacement of that portion of the first connection terminal 14 which floats from the upper surface of the adhesive layer 12. Then, the resin sealing film 27 made of an epoxy resin is formed on the upper surface of the film substrate 11 including or around the semiconductor chip 23 and excluding the sprocket hold-forming region.

Figure 15:
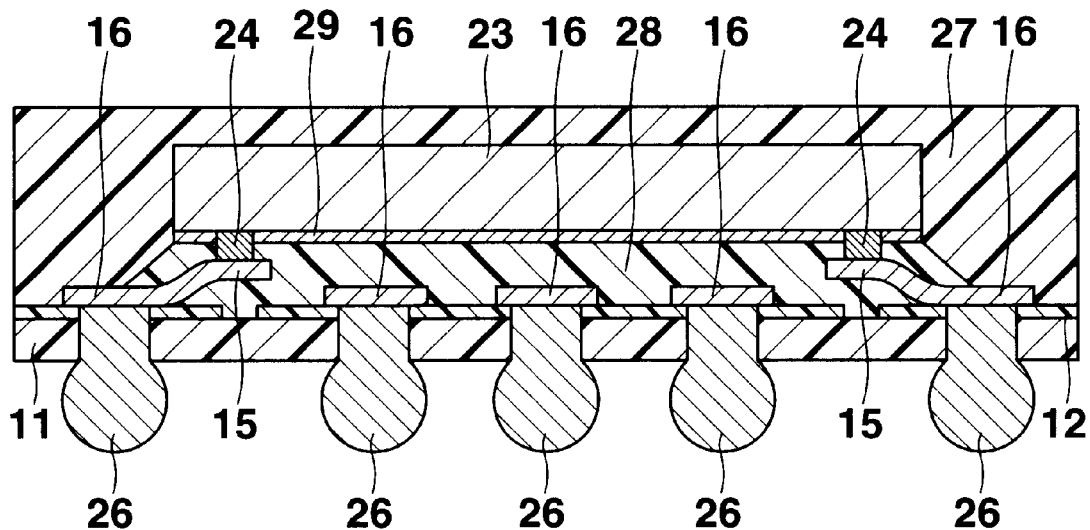
FIG. 15 is a cross sectional view showing in a magnified fashion another modification of FIG. 13.

FIG. 15 shows a third example of sealing the semiconductor chip 23. The example shown in FIG. 15 differs from the example shown in FIG. 14 in that a resin sealing film 29 made of an epoxy resin is formed on the lower surface of the semiconductor chip 23 such that the bump electrode 24 protrudes downward through the resin sealing film 29. The resin sealing film 29 can be formed by, for example, potting an epoxy resin in the central portion on the upper surface (lower surface in FIG. 12) of the wafer for forming the semiconductor chip 23, followed by rotating the wafer at a high speed so as to form the resin sealing film 29 on the upper surface of the wafer such that bump electrode 24 protrudes therefrom. It is also possible to form the resin sealing film 29 by printing a solder resist on the upper surface of the wafer by a screen printing method. Incidentally, it is possible not to form the under-filling material 28 and not to form the resin sealing film 27 in the structure shown in FIG. 15.

Figure 16:
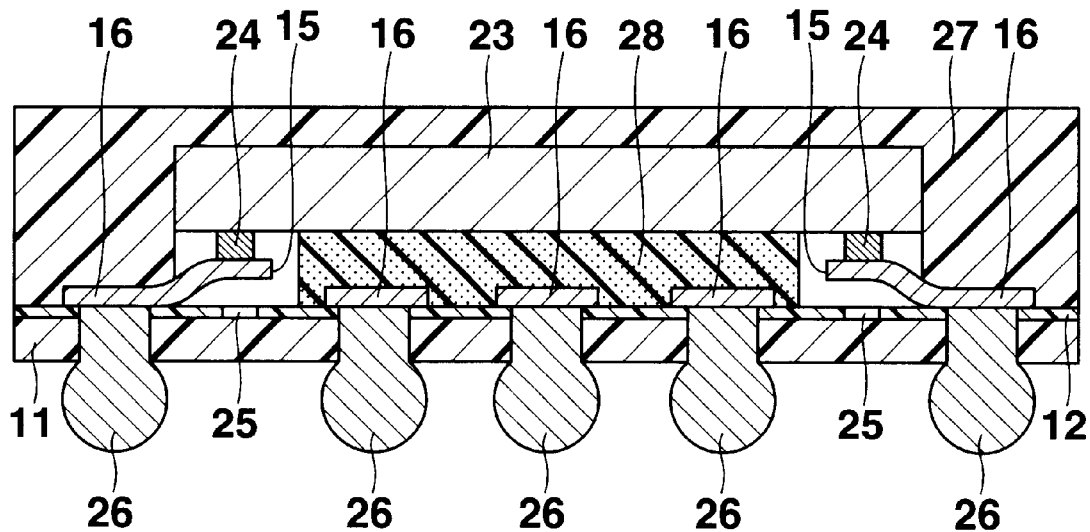
FIG. 16 is a cross sectional view showing in a magnified fashion still another modification of FIG. 13.
Figure 17:
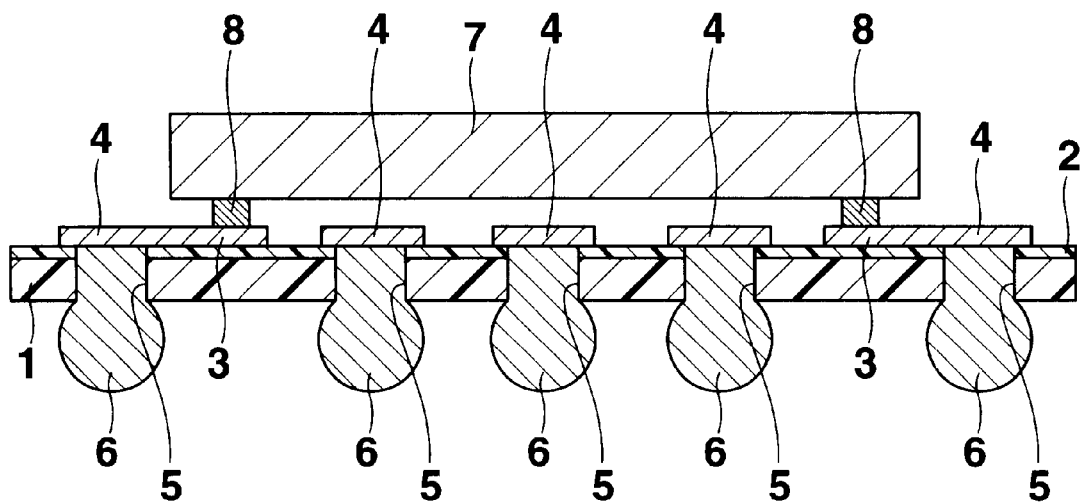
FIG. 17 is a cross sectional view showing in a magnified fashion the conventional connection structure between a circuit substrate and a semiconductor chip.

FIG. 16 shows a fourth example of sealing the semiconductor chip 23. In this case, the under-filling material 28 is formed by printing a rubbery elastic resin called elastomer by a screen printing method or by attaching a rubbery elastic resin sheet to the upper surface of the adhesive layer 12 including the second connection terminals 16, etc. and excluding the opening 25 and the region in the vicinity of the opening 25 of the adhesive layer 12, before the bonding step shown in FIG. 5. In this case, the under-filling material 28 is compressed appropriately in the subsequent bonding step shown in FIG. 5 and, after the bonding step, the under-filling material 28 is elastically brought back to the original state. As a result, the semiconductor chip 23 is forcedly moved away from the film substrate 11. It follows that the junction between the first connection terminal 15 and the bump electrode 24 is forcedly caused to float from the upper surface of the adhesive layer 12.

In each of the embodiments described above, the opening 25 is formed in the adhesive layer 12 by controlling the bonding conditions in the bonding step. Alternatively, it is also possible to remove in advance a predetermined portion of the adhesive layer 12 to form in advance the opening 25 in the adhesive layer 12. In this case, the bonding conditions are not particularly limited. Also, a glass epoxy substrate, a ceramic substrate, etc. can be used in place of the film substrate. Further, the technical idea of the present invention can be applied not only to BGA of the COF (Chip On film) structure but also to COF structure itself.

As described above, the junction between the connection terminal and the bump electrode is allowed to float from the upper surface of the substrate in the present invention, making it possible for the connection terminal to be displaced in the floating portion. It follows that the stress of the substrate can be absorbed by the connection terminal so as to ensure a good electrical connection.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a semiconductor chip having a plurality of electrodes;

preparing a substrate on which the semiconductor chip is to be mounted;

forming connection terminals each having a first end and a second end on one surface of the substrate, said connection terminals being bonded to the substrate with an adhesive layer interposed therebetween;

bonding the electrodes of the semiconductor chip to the second ends of the connection terminals;

compressing the electrodes of the semiconductor chip with the second ends of the connection terminals under bonding heat so as to (i) cause portions of the adhesive layer under the second ends of the connection terminals to substantially lose adhesiveness and render free the second ends of the connection terminals, and (ii) thermally elongate the substrate; and continuing compressing under a temperature lower than the bonding heat so as to: (i) cool and alloy the electrodes of the semiconductor chip and the second ends of the connection terminals cooled, and (ii) shrink the substrate;

whereby the connection terminals are bent together with shrinkage of the substrate such that the second ends of the connection terminals are moved upward so as to balance a weight of the semiconductor chip.

2. The method of manufacturing a semiconductor device according to claim 1, wherein the substrate has a thickness of about 75 $\mu$m.

3. The method of manufacturing a semiconductor device according to claim 1, wherein the adhesive layer comprises a polyamide-based adhesive.

4. The method of manufacturing a semiconductor device according to claim 1, wherein the adhesive layer has a thickness of about 8 $\mu$m.

5. The method of manufacturing a semiconductor device according to claim 1, wherein the connection terminals are formed of copper.

6. The method of manufacturing a semiconductor device according to claim 5, wherein the connection terminals have a thickness of about 18 $\mu$m.

7. The method of manufacturing a semiconductor device according to claim 5, wherein the connection terminals are plated with tin.

8. The method of manufacturing a semiconductor device according to claim 1, wherein the electrodes of the semiconductor chip are made of gold.

9. The method of manufacturing a semiconductor device according to claim 1, wherein a temperature of the bonding heat is in a range of 290° C. to 350° C.

10. The method of manufacturing a semiconductor device according to claim 1, wherein the electrodes of the semiconductor are compressed with the second ends of the connection terminals at a compression load in a range of 8 mgf/$\mu$m$^2$ to 12 mgf/$\mu$m$^2$.

11. The method of manufacturing a semiconductor device according to claim 1, wherein bonding of the electrodes of the semiconductor chip to the second ends of the connection terminals is performed on a stage heated to about 100° C.

12. The method of manufacturing a semiconductor device according to claim 1, wherein the substrate is a film substrate.

13. The method of manufacturing a semiconductor device according to claim 1, wherein an under-filling material is interposed between the semiconductor chip and the substrate.

* * * * *